United States Patent
Sandstrom et al.

(10) Patent No.: US 6,624,878 B1
(45) Date of Patent: Sep. 23, 2003

(54) LASER WRITER

(75) Inventors: Torbjorn Sandstrom, Pixbo (SE); Leif Odselius, Upplands Vasby (SE); Anders Thuren, Taby (SE); Stefan Gullstrand, Danderyd (SE)

(73) Assignee: Micronic Laser Systems AB, Täby (SE)

(*) Notice: Subject to any disclaimer, the term of this patent is extended or adjusted under 35 U.S.C. 154(b) by 0 days.

(21) Appl. No.: 09/869,922
(22) PCT Filed: Jan. 21, 2000
(86) PCT No.: PCT/SE00/00136
§ 371 (c)(1),
(2), (4) Date: Nov. 2, 2001
(87) PCT Pub. No.: WO00/43838
PCT Pub. Date: Jul. 27, 2000

(30) Foreign Application Priority Data
Jan. 21, 1999 (SE) .................................. 9900170

(51) Int. Cl.⁷ .................. G03B 27/42; G03B 27/54; G03B 27/74; G03B 27/72; B41J 2/435
(52) U.S. Cl. ........................ 355/53; 355/67; 355/68; 355/71; 358/1.14; 347/250
(58) Field of Search ................... 355/53, 35, 67, 355/68, 71; 358/1.7, 3.04, 3.24, 3.26, 1.12, 1.14, 413; 356/394; 347/258, 224, 236, 237, 246, 247, 248, 250

(56) References Cited

U.S. PATENT DOCUMENTS

| | | | | |
|---|---|---|---|---|
| 3,632,205 A | * | 1/1972 | Marcy | 355/53 |
| 4,218,142 A | | 8/1980 | Kryger et al. | 356/394 |
| 4,313,188 A | * | 1/1982 | Bartolini et al. | 369/100 |
| 4,464,030 A | * | 8/1984 | Gale et al. | 396/548 |
| 4,477,821 A | * | 10/1984 | Yamamoto et al. | 347/255 |
| 4,598,197 A | | 7/1986 | Morita et al. | 250/209 |
| 5,315,111 A | * | 5/1994 | Burns et al. | 250/235 |
| 5,477,304 A | | 12/1995 | Nishi | 355/53 |
| 5,495,279 A | * | 2/1996 | Sandstrom | 347/258 |
| 5,631,692 A | * | 5/1997 | Maruyama | 347/262 |

FOREIGN PATENT DOCUMENTS

| EP | A2 0467076 | 1/1992 |
|---|---|---|
| JP | A9186074 | 7/1997 |

* cited by examiner

Primary Examiner—Rodney Fuller
(74) Attorney, Agent, or Firm—Birch, Stewart, Kolasch & Birch, LLP

(57) ABSTRACT

A system and method are provided for microlithographic writing on photosensitive substrates, and especially high precision printing of patterns, such as photomasks, for semiconductor device patterns, display panels, integrated optical devices and electronic interconnect structures. The method includes the steps of detecting significant temporary writing error conditions and interrupting the writing process as a response to a detection of such an error condition. Thereafter a support table is reversed to the position it had when the writing was interrupted, and the writing process is restarted at the same position where the writing was interrupted when the error condition ceases to exist.

21 Claims, 4 Drawing Sheets

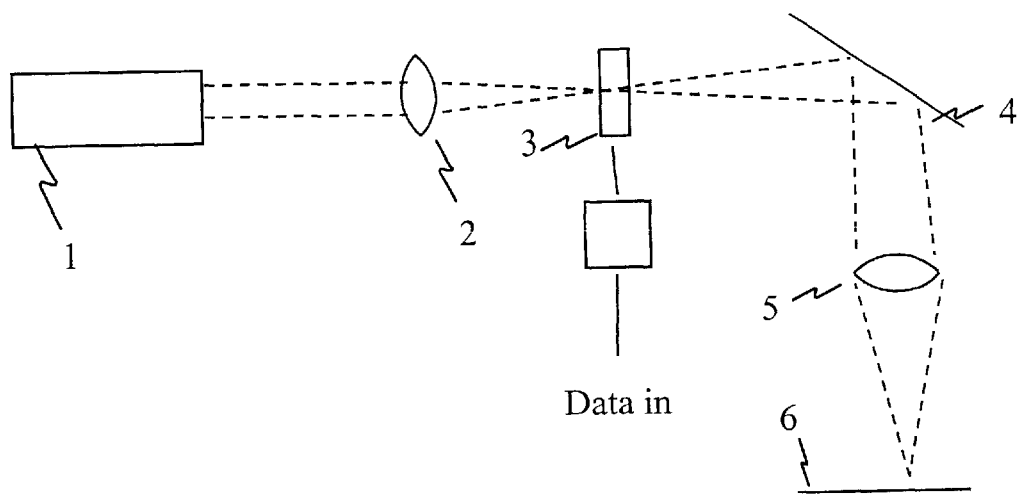
Fig 1 - Prior art
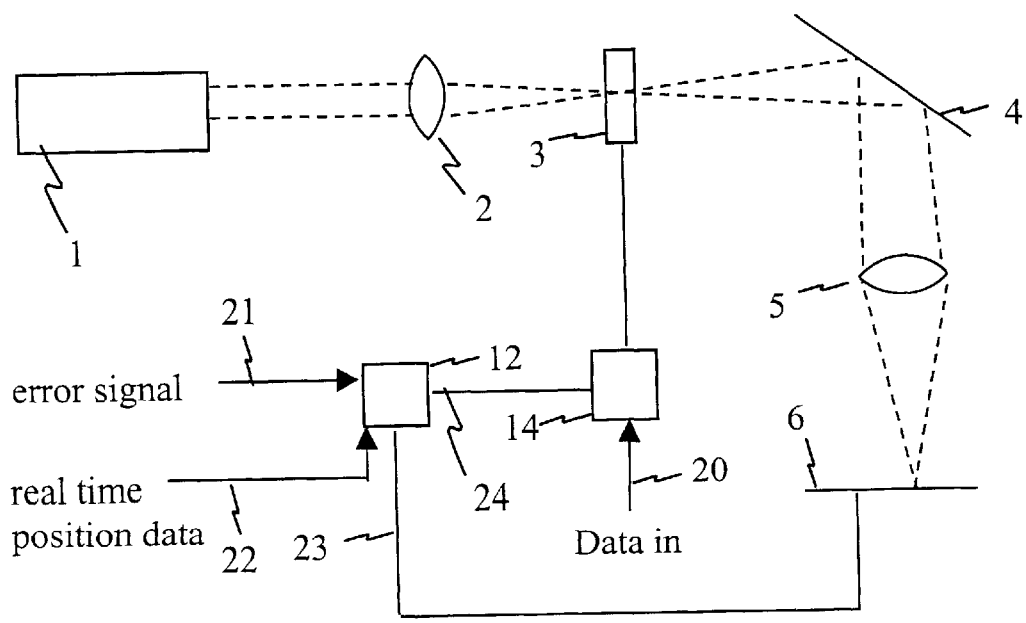
Fig 2

LASER WRITER

This application is the national phase under 35 U.S.C. § 371 of PCT International Application No. PCT/SE00/00136 which has an International filing date of Jan. 21, 2000, which designated the United States of America and was published in English.

FIELD OF THE INVENTION

The present invention relates to a system and a method for microlithographic writing on photosensitive substrates, and specially printing of patterns with extremely high precision, such as photomasks for semiconductor device patterns, display panels, integrated optical devices and electronic interconnect structures. The terms writing and printing should be understood in a broad sense, meaning exposure of photoresist and photographic emulsion, but also the action of light on other light sensitive media such as dry-process paper, by ablation or chemical processes activated by light or heat. Light is not limited to mean visible light, but a wide range of wavelengths from infrared to extreme UV.

BACKGROUND OF THE INVENTION

A system and method for microlithographic writing of a substrate is previously known from e.g. EP 0 467 076 by the same applicant. In general a system for microlithographic writing, as is shown in FIG. 1, comprises a light source 1, such as a laser, a first lens 2 to contract the light beams, a modulator 3 to produce the desired pattern to be written, the modulator being controlled according to input data, a reflecting mirror 4 to direct the beams towards the substrate 6, and a lens 5 to contract the beams before the reach the substrate. The mirror 4 can be used for a scanning operation to scan the beam over scan lines at the substrate. Several functionally equivalent scanners such as acusto-optic deflectors etc. could also be used. Further, the substrate is preferably arranged on a object table. Two-dimensional relative motion between the lens 5 and the table (stage) is provided and controlled by servo systems. For example the object table could be movable in at least two orthogonal directions, by means of two electrical servomotors. This motion is an inertial mechanical motion, and it is relatively difficult to change the velocity motion quickly. Further, this is irrespective of if it is the object table or the lens that is moving, since both possess a substantial mass.

However, a problem with such known writing systems are that the emitted output power from the laser is not constant, but suffers from significant variations due to so called drop-outs. Such drop-outs are significant drops in the light output, typically at least a 25% power drop, with a typical duration of about 500 µs, and they occurs once every 10 h –1000 h, depending on the type of laser, the age of the laser etc. The problem is especially important for continuous gas lasers.

A short drop-out for about 500 µs can typically result in a loss of about 20 scan-lines in the pattern, and such an unwanted hole in the pattern normally ruins the whole mask. For very large patterns, such as large-area photomasks, which normally take about 10 hours to write, the problem is more likely to occur, at the same time as the value of an error free mask is very high.

Several other problems of the same kind could arise, such as electronic errors, vibration errors and the like. These problems also generate temporary interruptions in the continuous writing process.

Other types of pattern generators encounter similar problems, and the invention is not limited to pattern generators using microlithography.

SUMMARY OF THE INVENTION

It is therefore an object of the present invention to provide a system in which the above mentioned temporary abnormal interruption problems in the prior art are solved.

This object is achieved with a system according to the appended claims.

By abnormal writing error conditions are in this application meant error conditions that can be detected and are abnormal in the sense that they could not in practice be foreseen. Hence, problems that occur at regular time intervals are not considered abnormal, and neither is for example "data starve", i.e. when the supply of data is too slow relative to the writing speed, in a system where this condition can be foreseen from data volume and writing mechanics and handled in an ordinary fashion.

SHORT DESCRIPTION OF THE DRAWINGS

For exemplifying purposes, the invention will be described in closer detail in the following with reference to embodiments thereof illustrated in the attached drawings, wherein:

FIG. 1 is a schematic view of a system according to prior art;

FIG. 2 is a schematic view of a system according to a first embodiment of the invention;

DESCRIPTION OF PREFERRED EMBODIMENTS

Figure 3:
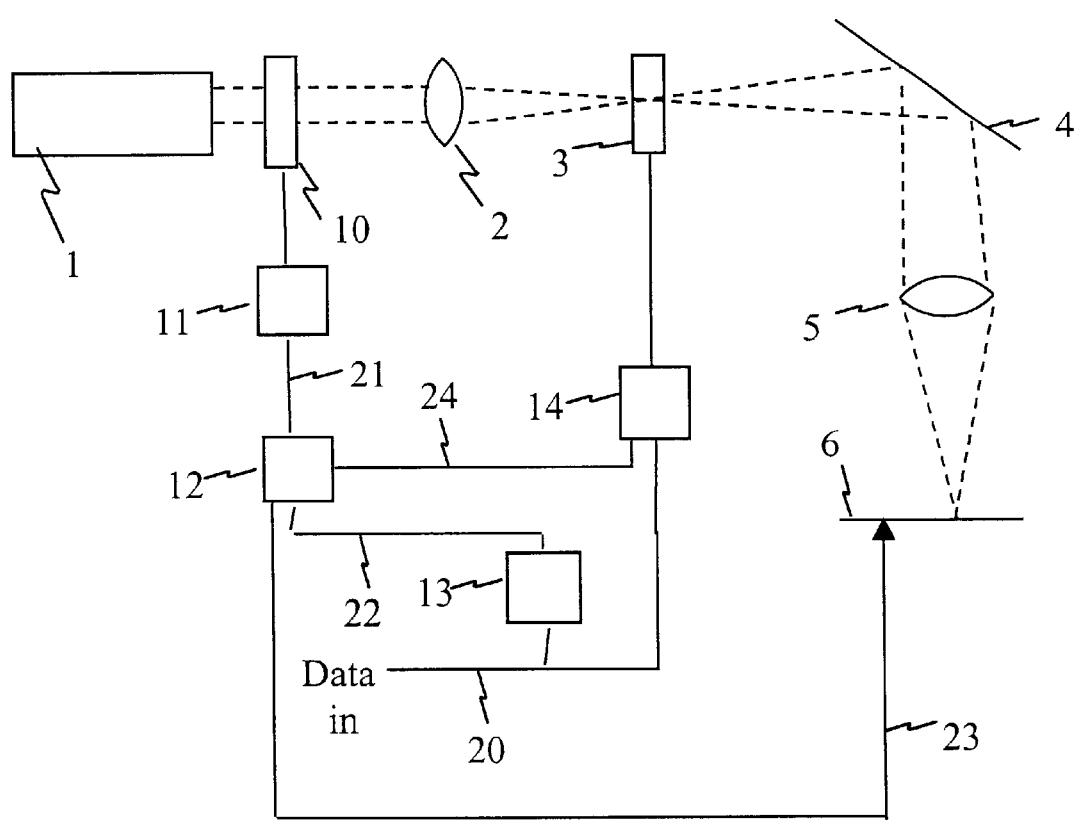
FIG. 3 is a schematic view of a second embodiment of the invention.

Referring to FIG. 2, the system according to a first embodiment of the invention comprises a light source 1, which is a continuous laser, a computer-controlled light modulator 3 and a lens 5 to contract the light beam from the light source before it reaches the photosensitive substrate 6. Further it comprises a second contracting lens 2 ahead of the modulator. The laser is e.g. a ion laser, such as a 413 nm, 100 mW krypton ion laser. The modulator controls the beam according to input data 20.

The system according to the invention is a so called "write on the fly" system, where the substrate is placed on a substrate table, and the substrate table performs a continuous motion in at least one direction during the writing process, and the laser beam is at the same time scanned in another direction. The object table has a relatively large mass, and the motion of the same is therefore an inertial mechanical motion, which is difficult to control quickly. However, it is also possible to move the lens 5 relative to the stage during the writing process. This motion will however also be an inertial mechanical motion. The mirror 4 can preferably be used for the scanning operation to scan the beam over scan lines at the substrate. However, several functionally equivalent scanners such as acusto-optic deflectors etc. could also be used.

Further the system comprises an error recovery unit 12, and at least one error detector 10 (see FIG. 3). The error detector detects significant temporary errors that arise during the writing process, such as laser dropouts, electronic errors, errors due to vibrations, errors due to data overload etc. In case of a detected error, the detector provides an error signal 21 to the recovery unit 12.

A position detecting means, such as a counter 13 (see FIG. 3), is also provided, and keeps track of the current position of the beam on the substrate. This position detecting means provides a real time position signal 22 to the error recovery unit 12.

Furthermore, the error recovery unit 12 is connected to the position controlling means of a stage or the lens 5. Hereby, the recovery unit is able to control the position where the beam hits the substrate, by means of a position control signal 23. The recovery unit is also connected to a data switch 14, to turn on/off the data stream 20 being supplied to the modulator, by means of a data control signal 24.

In a more detailed, second embodiment, shown in FIG. 3, tone detector detects the output power from the laser. Such a detector could be transparent, and be positioned in the beam path. Alternatively it is positioned away from the beam path, whereby a semi-transparent mirror could be used to direct the beam towards the detector. The detector; is preferably positioned close to the laser.

The detector signal is preferably first forwarded to a filter 11 to avoid noise in the detector signal, and to thereby make the detector more sensitive for significant variations in the output power. In addition, or alternatively, the unit 11 could comprise a comparator comparing the detector signal with a threshold value.

The position signal 22 is in this embodiment provided by an incremental counter 13, counting the number of bytes that has been forwarded to the modulator since a predetermined starting point. From the counter value the current position of the beam spot on the substrate is deducible.

Figure 4:
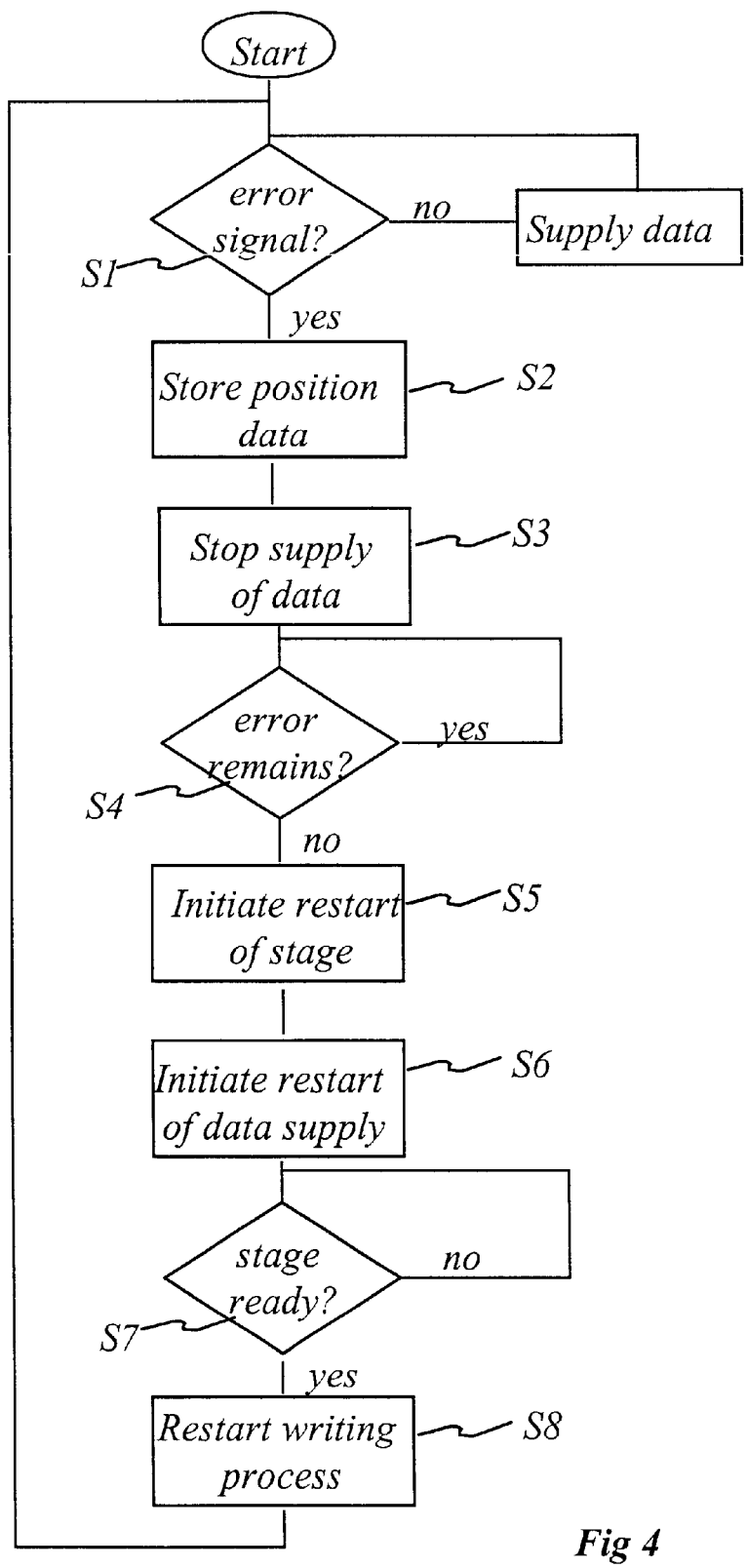
FIG. 4 is a schematic block diagram showing the operation of the error recovery unit according to the invention.

In FIG. 4 a block diagram is shown, presenting the operation of an error recovery unit 12 according to the invention. In a first step S1 the signal from the error detector is evaluated to determine if there exist a significant temporary error, such as a significantly decreased laser power. If such an error does not exist, the data stream will be allowed to continue, by keeping the data switch 14 in the ON condition. On the other hand, if an error does exist, the position data is stored in a memory, in step S2. Thereafter, in step S3, a data control signal 24 is sent to the data switch 14 in order to change to the OFF condition. Then, it is determined, in step S4, if the error remains. The operation process will not continue to the next step as long as the error remains. When the error signal; from the detector communicates to the recovery unit that the error condition has ceased to exist, e.g. when the laser power is regained, the process continues to step S5. Here, the stage is initiated to a restart of the writing process. This is made by providing a position control signal 23 to the position controlling means for the stage. Hereby, the stage is retracted to the position where the writing was interrupted. Preferably, a restart of the data supply is also initiated, to make the data delivery unit ready to supply data from the point where the error occurred, in step S6. However, this step may not be necessary if the data delivery unit is directly notified of the interruption. This could be achieved by forwarding: the data control signal 24 to the data delivery unit as well, or if the data switch and the data delivery unit are integrated. In step S7 it is determined if the stage is fully retracted, and ready for a restart. The operation process will not continue to the next step as long as the stage is not ready. When the stage is fully retracted the writing process is restarted, in step S8. This is accomplished by forwarding a data control signal to put the data switch in the ON condition. As a consequence of the stage being retracted, the writing will continue at the same spot as the error interruption occurred. Hence, there will be no holes or other damages due to the error interruption.

Figure 5:
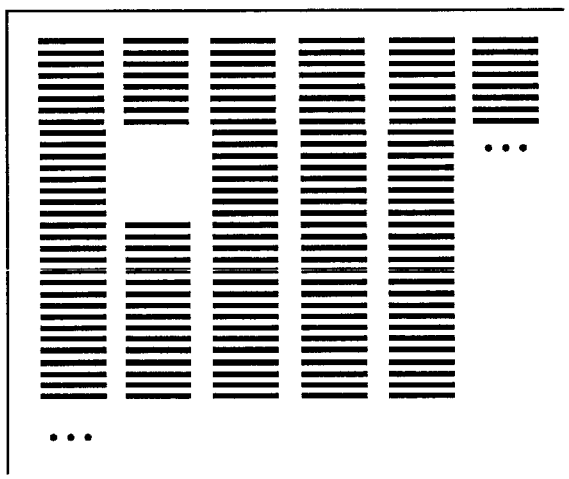
FIG. 5 is a schematic view of a mask written during a drop-out with a system according to prior art.
Figure 6:
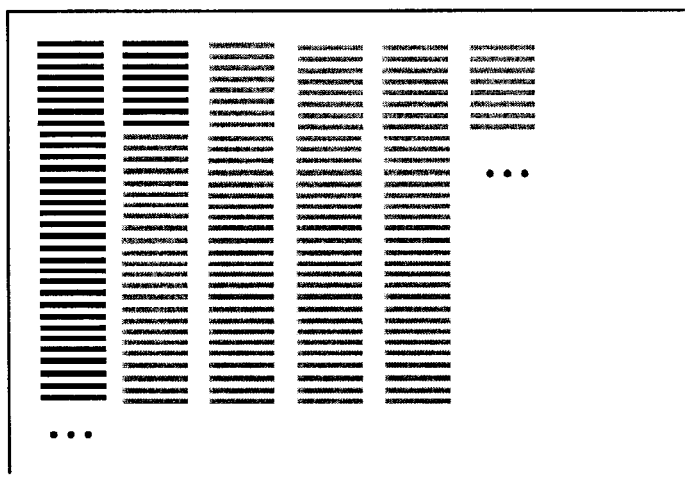
FIG. 6 is a schematic view of a mask written during a drop-out with a system according to the invention.

In FIG. 5, a schematic example is shown of a substrate where an temporary error interruption has occurred. The writing is made in scan lines, written from the left to the right in the figure, and each line are written beneath the previous one, due to the continuous upward motion of the stage. When a whole stripe is written, the stage is moved down again, and at the same time slightly to the left, where after the next stripe is written. During the writing of the second strip the error has occurred. The error has caused several scan lines not to be written, and the substrate is severely damaged practically useless. When the writer system according to the invention is used, the writing process will be interrupted as soon as the error occurs. The stage is then stopped and retraced, and thereafter the writing process will continue from where the interruption begun, as is indicated by the dashed scan lines. Hence, there will be no errors on the substrate.

Figure 7:
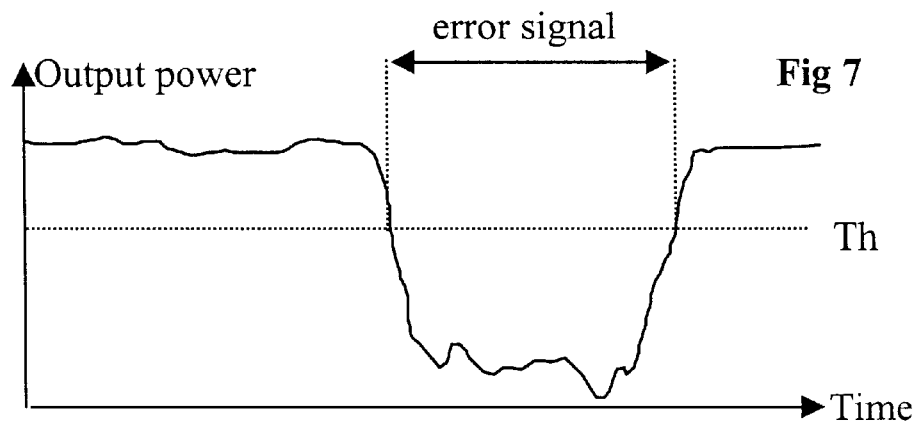
FIG. 7 is a curve representing the output power of a laser versus time.

In FIG. 7 an example of the generation of an error signal is shown schematically. The detector, in this case a laser power detector, provides a signal indicating the value of output power. The power signal is compared with an threshold value, Th, and during the initial small power variations no error signal will be given. However, when, after some time, the power drops significantly, an error signal is given to stop the writing process. The error signal will continue until the laser power is regained, and again is higher than the predetermined threshold value.

However, the detector could instead comprise a deriving filter and, hence, react on the derivative or differential quotient for the signal being higher than a predetermined threshold value. Hereby, the detector would be very sensitive, and react very fast. However, it might occur some false error detections due to noise etc., but since the system according to the invention takes care of the situation this is just a minor problem. The false error stops will cause no visible signs or marks on the substrate, and the time needed, and hence the cost, for an extra stop is negligible.

In an alternative embodiment, in the case of a detected abnormal error condition, the position for the stage at the time when the error occurred is stored. However, the writing process is not interrupted, but is carried through, whereby some parts of the pattern will be missing on the substrate, such as is shown in FIG. 5. Thereafter, when the writing process is completed, a position control signal 23 to the position controlling means for the stage is provided and the stage is retracted to the position is retracted to a position before where the writing was interrupted. Thereafter, a restart of the data supply is initiated, to make the data delivery unit ready to supply data from the point where the error occurred, and the writing process is restarted. The writing process is then interrupted where the abnormal error condition ceased to exist,land where the previous writing of the substrate were in order. Hence, the holes or other damages due to the error have been repaired. In this alternative embodiment, the data stream could be allowed to continue during the time period when the error condition exist, but preferably it is interrupted, and is not allowed to continue as long as the error remains. In this embodiment it is further of great importance to store not only data to be able to identify the position where the writing process were interrupted, i.e. when the error occurs, but also the position where the writing process restarted, i.e. where the error ceased to exist, or, in the case where the data stream was interrupted, where the data flow was continued to be supplied.

It should be noted, that it is also possible to perform the slow relative motion by moving the lens 5 instead of the stage 6, even though the stage is moved in the examples given above. It should also be possible to have other detectors, or even several different detectors, connected to the error recovery unit, detecting different abnormal errors likely to occur during the writing process. Such abnormal errors could be

- transients in the laser;
- bit errors in the data supply, which could be detected by for example checksum controls;
- too large mechanical vibrations, such as mechanical vibrations exceeding a predetermined threshold value.

The position detecting means could be a counter for counting the number of scan lines being written, the number of clock cycles the writing operation has lasted etc. However, other position detecting means could be used. Several other variations of the above-mentioned embodiments are also possible, and obvious for a person skilled in the art.

Further, the invention has above been described with reference to a microlithography system, where photons (light) is used as the radiant energy. However, other types of radiant energy may be used as well, such as charged particles, electrons, ions, EUV (Extreme Ultra Violet), and other radiant energies suitable for substrate exposure. Further, other types of pattern generators may be used. For example, the pattern generator may use an acousto-optic modulator to control the radiant energy according to input data, as well as a voltage controlled trolled modulator or an SLM (Spatial Light Modulator). If charged particles are used, the pattern generator may either be of the type using raster scanning or the type using shaped beams. In the case when an SLM is used, an abnormal error condition could be the case of unwanted absence of light pulses, or errors in the input pattern data. When such errors in the input data are detected, which could be accomplished by a checksum test, the immediate response action could be to load zeros to the modulator, to get a zero exposure, or to stop the light flash from being emitted, by not transferring a trigger signal to the light source.

Such obvious modifications must be considered as being part of the invention, as it is defined by the following claims.

The invention makes the production of large area display panels more efficient and cost effective by increasing the yield of the production and decreasing the needed rewriting. At the same time the pattern precision is improved. Further, the invention makes it possible to use each laser for a longer period of time, before it need to be exchanged.

What is claimed is:

1. A pattern generator system for writing of patterns on a substrate (6) with a layer being sensitive for a radiant energy, the system comprising a source (1) for emitting such radiant energy, a computer-controlled modulator (3), a lens for creating a pattern by the radiant energy on the substrate, and a substrate support table to support the substrate, whereby the writing operation comprises a relative motion between the lens (5) and the support table (6) during the writing operation, which motion involves an inertial mechanical motion, and further comprising a detector (10) for detecting abnormal temporary writing error conditions, and an error recovery system (12) for enabling a restart of the writing process at a position where the writing was interrupted when the error condition has ceased to exist.

2. A system according to claim 1, wherein the error recovery system further comprises an interrupter (12) responsive to said detector for stopping the writing process in case of said error writing condition, for enabling a restart of the writing process at the position where the writing was interrupted when the error condition has ceased to exist.

3. A system according to claim 2, wherein the interrupter comprises a counter (13) counting the number of scan-lines being written.

4. A system according to claim 2, wherein the interrupter comprises a counter (13) counting the number of clock cycles during the writing operation.

5. A system according to claim 2, wherein the recovery system comprises storage means (13) for storing information from which is deducible the writing position where the abnormal error condition occurred.

6. A system according to claim 1, further comprising means for retracting the support table and restarting the exposure at the position where the writing was interrupted directly after the error condition has ceased to exist.

7. A system according to claim 1, further comprising means for retracting the support table and restarting the exposure at the position where the writing was interrupted when the writing process is completed.

8. A system according to claim 7, wherein the recovery system comprises storage means (13) for storing information from which is deducible the writing position where the abnormal error condition ceased to exist.

9. A system according to claim 1, wherein the detector is a detector for detecting significant changes in the emitted output power from the laser.

10. A system according to claim 1, wherein the detector comprises a threshold value comparator, whereby only changes exceeding a certain threshold value give rise to a signal affecting the interrupting means.

11. A system according to claim 1, wherein the detector is a detector for detecting electronic errors.

12. A system according to claim 1, wherein the detector is a detector for detecting bit errors in the supplied data, and preferably a checksum detector.

13. A method for writing of patterns with a pattern generator system on a substrate (6) with a layer being sensitive to radiant energy, the system comprising a source (1) for emitting radiant energy, a computer-controlled modulator (3), a lens to create a pattern by the radiant energy on the substrate, and a substrate support table, which is movable in at least one direction and performs an inertial mechanical motion during the laser scanning operation, c h a r a c t e r i s e d by the further steps of detecting significant abnormal temporary writing error conditions, and subsequently restarting the writing process at the position where the writing was interrupted when the error condition has ceased to exist.

14. A method according to claim 13, comprising the further step of interrupting the writing process in case of an abnormal writing error condition, for enabling a restart of the writing process at the position where the writing was interrupted when the error condition has ceased to exist.

15. A method according to claim 14, wherein the interrupting step comprises the further step of storing information from which is deducible the writing position where the abnormal error condition occurred.

16. A method according to claim 13, further comprising the step of retracting the support table and restarting the exposure at the position where the writing was interrupted directly after the error condition has ceased to exist.

17. A method according to claim 13, further comprising the step of or retracting the support table and restarting the exposure at the position where the writing was interrupted when the writing process is completed.

18. A method according to claim 17, further comprising the step of storing information from which is deducible the writing position where the abnormal error condition ceased to exist.

19. A method according to claim 13, wherein significant changes in the emitted output power from the laser are detected in the step of detection.

20. A method according to claim 13, wherein electronic errors are detected in the step of detection.

21. A method according to claim 13, bit errors in the supplied data are detected in the step of detection.

* * * * *